United States Patent
Sicignano et al.

(10) Patent No.: US 6,753,963 B1
(45) Date of Patent: Jun. 22, 2004

(54) METHOD OF CALIBRATION OF MAGNIFICATION OF OPTICAL DEVICES

(75) Inventors: Albert Sicignano, Mt. Kisco, NY (US); Tim Goldburt, Chappaqua, NY (US)

(73) Assignee: General Phosphorix, Ardsley, NY (US)

( * ) Notice: Subject to any disclaimer, the term of this patent is extended or adjusted under 35 U.S.C. 154(b) by 614 days.

(21) Appl. No.: 09/696,257

(22) Filed: Oct. 26, 2000

(51) Int. Cl.⁷ .................... G01B 11/00; G03B 27/57; G03B 27/32; G03F 9/00; G03C 5/00
(52) U.S. Cl. .................. 356/399; 355/67; 355/77; 430/5; 430/30
(58) Field of Search .................. 355/52, 53, 55, 355/67, 77; 430/5, 30; 356/399

(56) References Cited

U.S. PATENT DOCUMENTS

| | | | |
|---|---|---|---|
| 5,576,829 A | * | 11/1996 | Shiraishi et al. |
| 5,828,455 A | * | 10/1998 | Smith et al. |
| 5,952,160 A | * | 9/1999 | Bakeman, Jr. et al. |
| 5,978,085 A | * | 11/1999 | Smith et al. |
| 6,011,611 A | * | 1/2000 | Nomura et al. |
| 6,307,635 B1 | * | 10/2001 | Goldberg |
| 6,310,680 B1 | * | 10/2001 | Taniguchi |

* cited by examiner

*Primary Examiner*—Frank G. Font
*Assistant Examiner*—Khaled Brown
(74) *Attorney, Agent, or Firm*—I. Zborowsky

(57) ABSTRACT

A method of calibrating magnification of optical devices includes providing a mask with a predetermined pattern, projecting radiation through the mask so as to form a pattern image, and comparing a pattern of the image with a pattern of the mask to determine deviations of the image of the projected image from the image of the mask.

12 Claims, 6 Drawing Sheets

METHOD OF CALIBRATION OF MAGNIFICATION OF OPTICAL DEVICES

BACKGROUND OF THE INVENTION

The present invention relates to a method of calibration of magnification of optical devices.

More particularly, it relates to a method of calibration of such optical devices as steppers for forming patterns on silicon wafers, for calibration of scanning electron microscopes, etc.

During the manufacture of ICs on silicon wafers, the steppers are utilized to produce devices on a wafer. If the stepper is not properly operating, the physical features of the device produced of silicon wafers can have non uniform dimensions and therefore they will not operate in the intended manner.

Methods for calibration of magnification of steppers for this application are not known, and it is believed that it is therefore advisable to provide such calibration. As for scanning electron microscopes, methods of calibration of magnification are as disclosed for example in U.S. Pat. Nos. 5,902,703; 4,618,938; and 5,825,043; however, they are not precise.

SUMMARY OF THE INVENTION

Accordingly, it is an object of present invention to provide a method of calibration of magnification of optical devices, which is a further improvement of the existing methods.

In keeping with these objects and with others which will become apparent hereinafter, one feature of present invention resides, briefly stated, in a method of calibration of magnification of an optical device which includes providing a mask with a predetermined pattern; projecting radiation through the mask so as to form a pattern image; and comparing image of the pattern with a pattern on the mask to determine deviations of the image of the projected image from the patterns on the mask.

Where the method is designed in accordance with the present invention it eliminates the disadvantages of the prior art and provides for the highly advantageous results.

In accordance with a further feature of present invention the method includes comparing a size of the projected image with the size of the image on the mask.

In accordance with a further feature of present invention comparing the mask includes providing a mask which has at least two fields which having a plurality of features spaced from one another in one direction so that the directions of spacing of the features in said two fields are transverse to one another.

In accordance with a further feature of present invention the features in each of said field are evenly spaced from one another. In accordance with a further feature of present invention the features in each of said fields are parallel to one another.

In accordance with a further feature of present invention the method includes arranging the mask so that the features of at least one of said fields are aligned with a principal axis of the optical device.

In accordance with a further feature of present invention the features are arranged so that a spacing between the features of one of the fields is different from the spacing of the features of the other of said fields.

In accordance with a further feature of present invention the method includes moving an article on which the image is projected relative to the optical device so as to produce a plurality of images with a plurality of patterns, and the comparing includes comparing the plurality of patterns of the plurality of images with the pattern of the mask.

In accordance with a further feature of present invention the method includes projecting the pattern through the mask on the substrate, and obtaining the projected image on the substrate.

In accordance with a further feature of present invention the method includes passing the radiation through the mask to form patterns on a silicon wafer and obtaining an electronic image with a pattern, and comparing includes comparing the pattern of the electronic image from the silicon wafer with the pattern of the mask.

In accordance with a further feature of present invention the comparing includes comparing a deviation of a magnification of the pattern of the image relative to the pattern of the mask from a standard deviation.

In accordance with a further feature of present invention the method includes forming a mask by an optical source, and producing an interference pattern corresponding to the desired pattern of the mask.

In accordance with a further feature of present invention the method includes producing the mask by an optical source which generates an interference pattern and acts on a chemical substance causes etching of corresponding area of the mask so as to produce the desired pattern of the mask.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

A method of calibrating a magnification of an optical device includes using a mask which is designed and produced in accordance with the inventive method.

Figure 7:
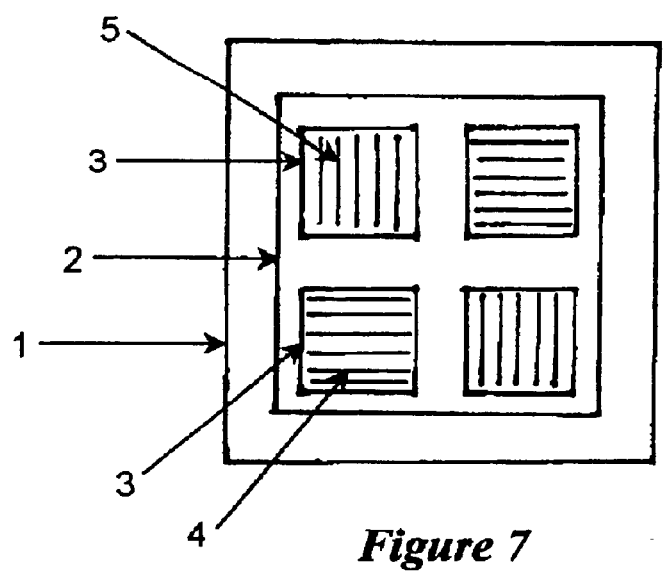
FIG. 7 is a view showing a mask used for the inventive method.
Figure 8:
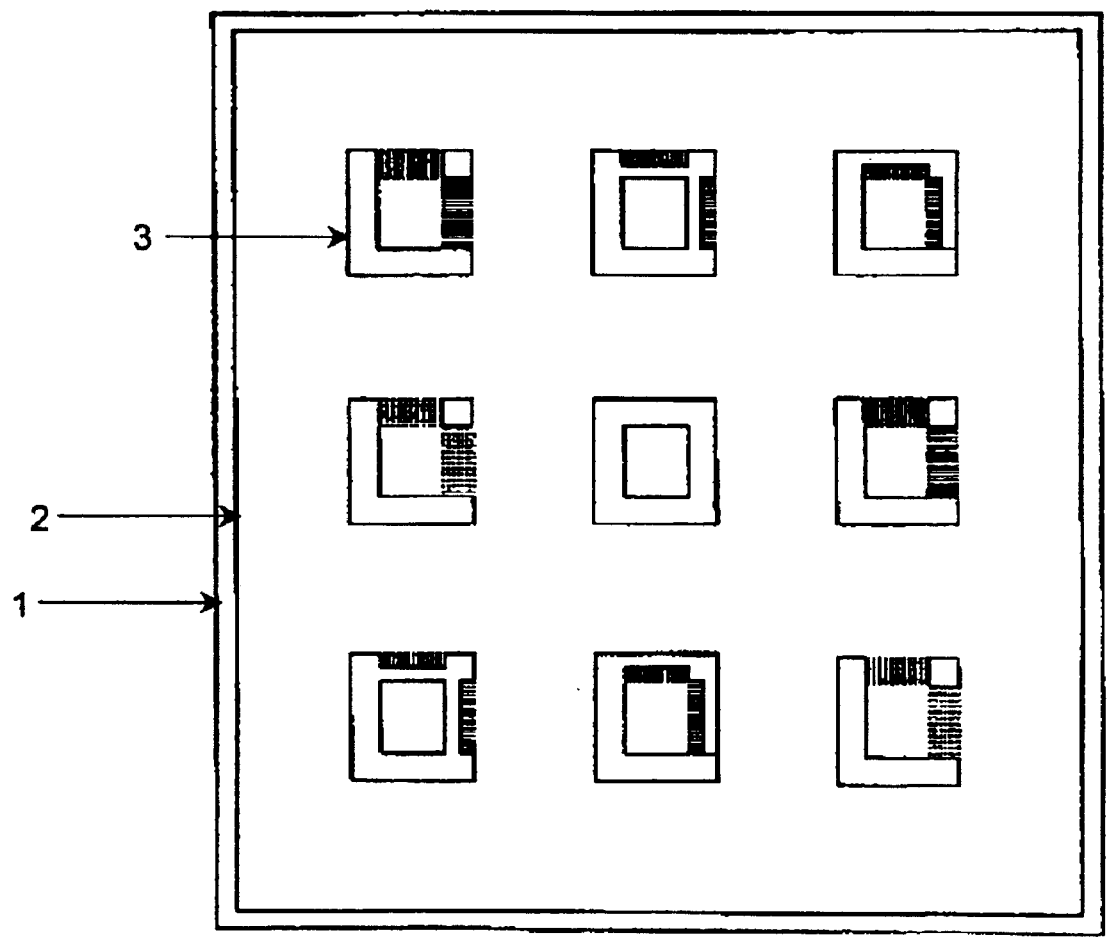
FIG. 8 is a view showing another embodiment of the mask used for the inventive method.
Figure 9:
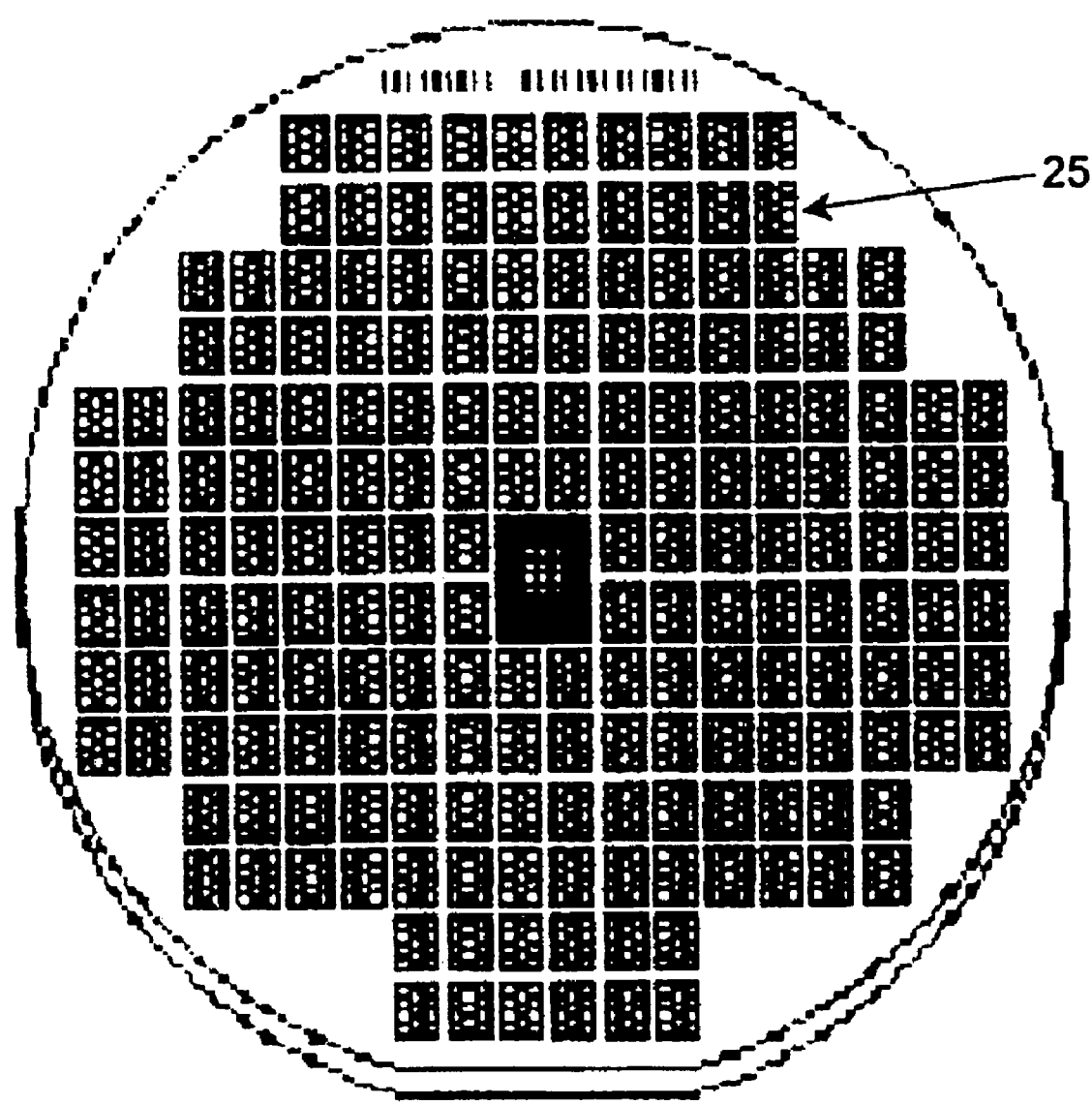
FIG. 9 is a view showing a plurality of images produced on a silicon wafer with the use of the mask in the inventive calibration method.

The mask is identified in FIG. 7 with reference numeral 1 as a whole and has at a reticle or a pattern area of the mask identified with the reference numeral 2. In the reticle at least two fields must be provided as identified with reference numeral 3. Each field has a plurality of features 4 and 5 which are spaced from one another. As can be seen from the drawings, features 4 extend in one predetermined direction, while the features 5 extend in another predetermined direction which is transverse to the first predetermined direction. The directions of extension of the features can be perpendicular to one another. The features can be formed for example as lines which preferably are parallel to one another. The lines in each field are spaced from one another preferably by equal distances. As shown in FIG. 7, there can be more than two fields, in particular here there are four fields in the single reticle. FIG. 8 shows that there can be a plurality of fields in a single reticle, each having a plurality of features spaced from one another.

The length of the features 5, 5' is a multiple of the pitch of the features. The pitch of the features can be for example 0.1, 0.2, 0.5, and 2 micron. A mask as shown in FIGS. 1–4 has a support structure 14, typically a quartz substrate, a chrome light blocking layer identified with reference numeral 13, an anti-reflective coating layer identified with reference numeral 12, and a photo resistive layer identified with reference numeral 11.

In order to produce the mask, a method of E-beam lithography can be utilized. First the above mentioned multilayer structure 11, 12, 13, 14 is produced. By using electron beam areas 15 between the features are exposed and then removed in a photoresist development, chemical removal step. Then corresponding portions of the chrome light blocking layer are chemically removed by supplying a chemical through the spaces in the photo resist layer. Finally the photo resist layer 11 is removed with another chemical process or a plasma etching process.

Figure 1:
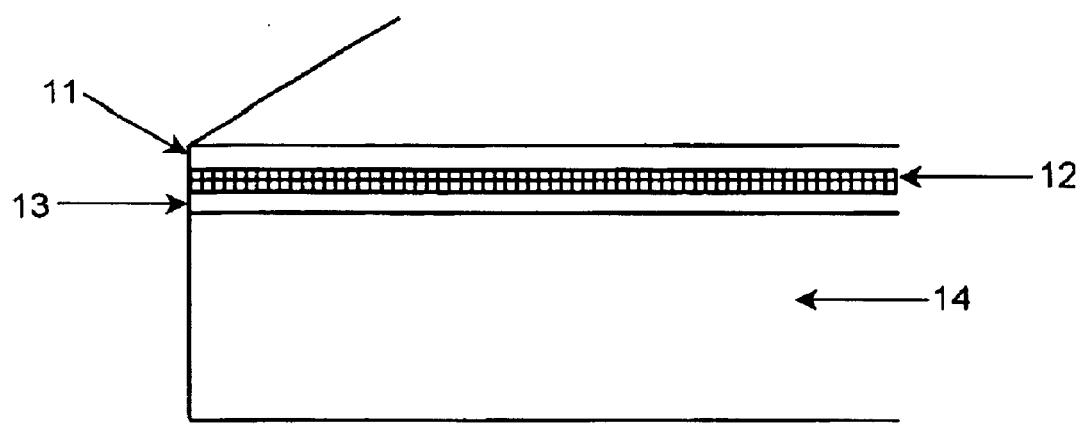
FIGS. 1–6 are views illustrating methods of making a mask for calibration of a magnification of an optical device.
Figure 2:
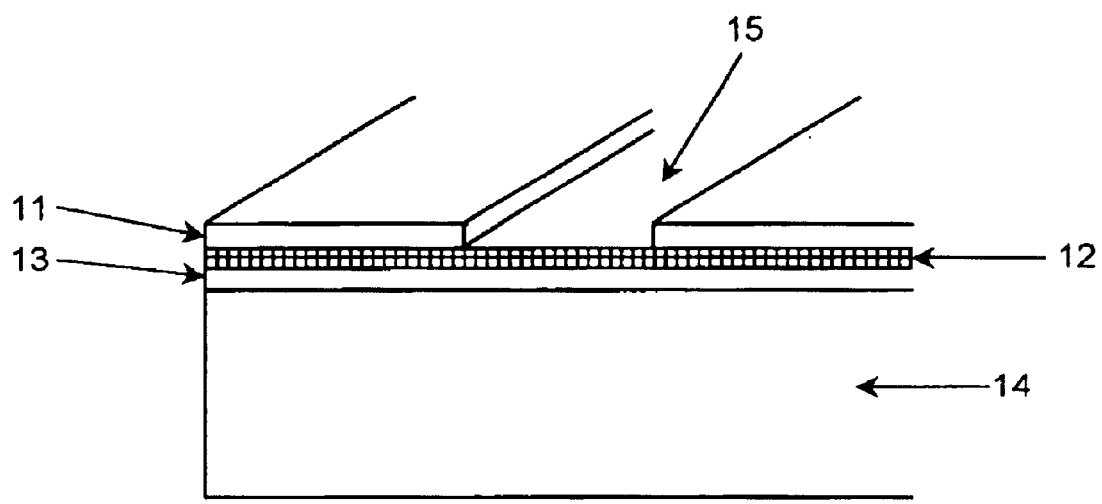
Figure 3:
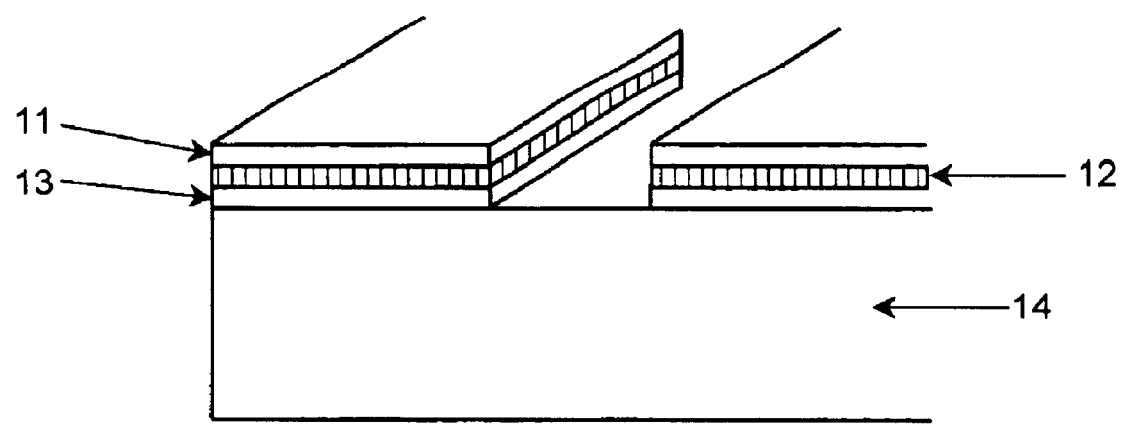
Figure 4:
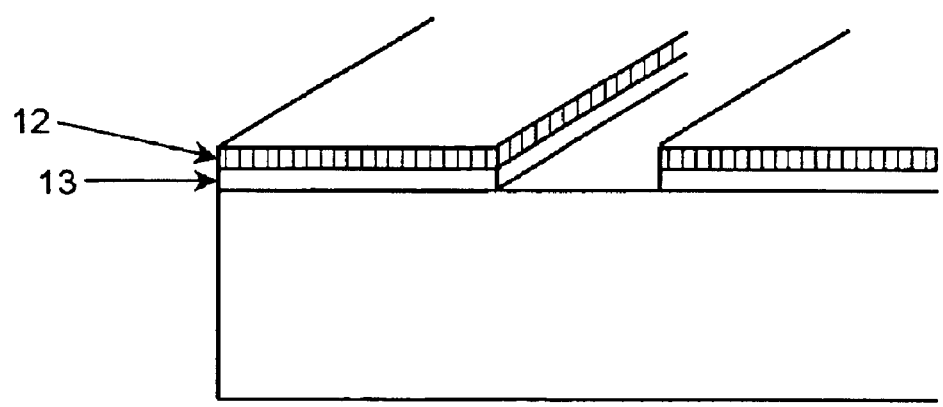
Figure 5:
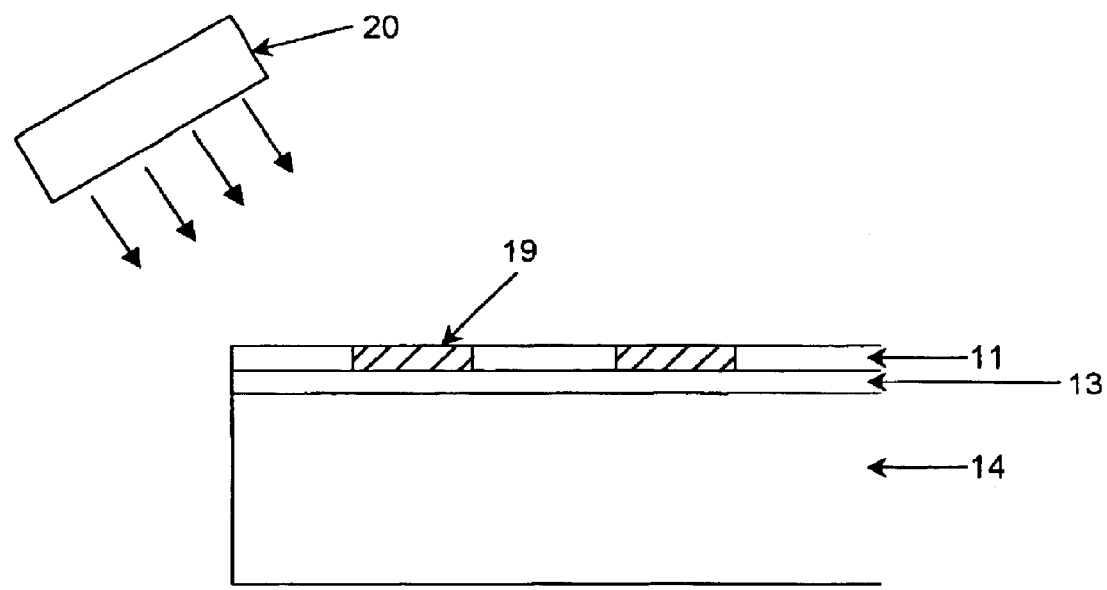

In accordance with another embodiment of the present invention shown in FIG. 5, a pattern can be produced on the mask by irradiation through an optical source which produces an interference pattern corresponding to the desired pattern of the mask. The optical source can be formed as a laser which generates two beams interacting with one another to produce an interference pattern with alternating variations in optical intensity.

In the embodiment of FIG. 5, reference numeral 19 identifies the area on the photo resist layer which was exposed, while reference numeral 20 identifies the optical source for producing an interference pattern.

Figure 6:
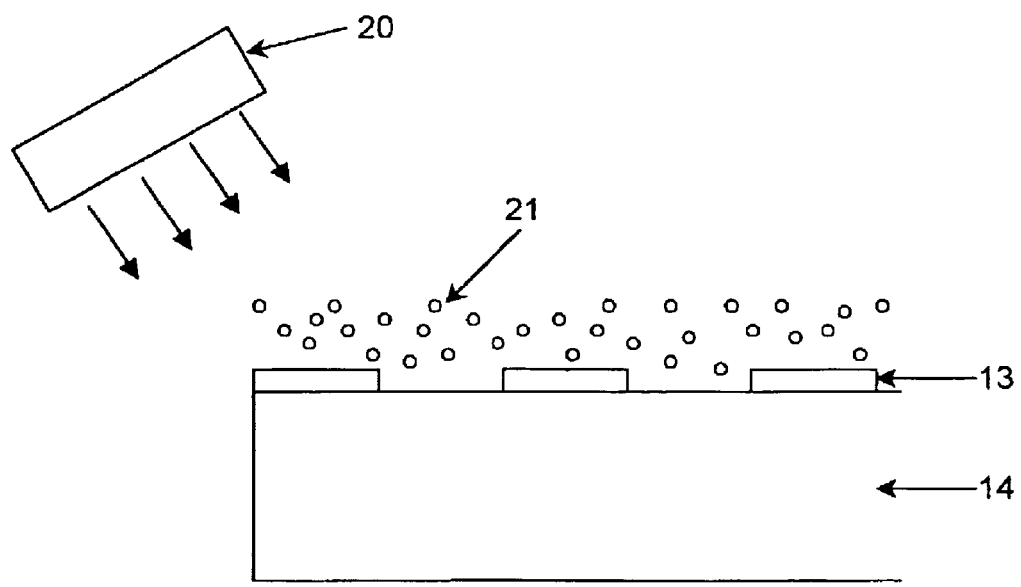

In the pattern of FIG. 6 also the optical source producing an interference pattern is utilized. In addition, a chemical substance 21 is used, which under the influence of the radiation performs a photo-stimulated chemical etching of the chrome layer 13.

Figure 10:
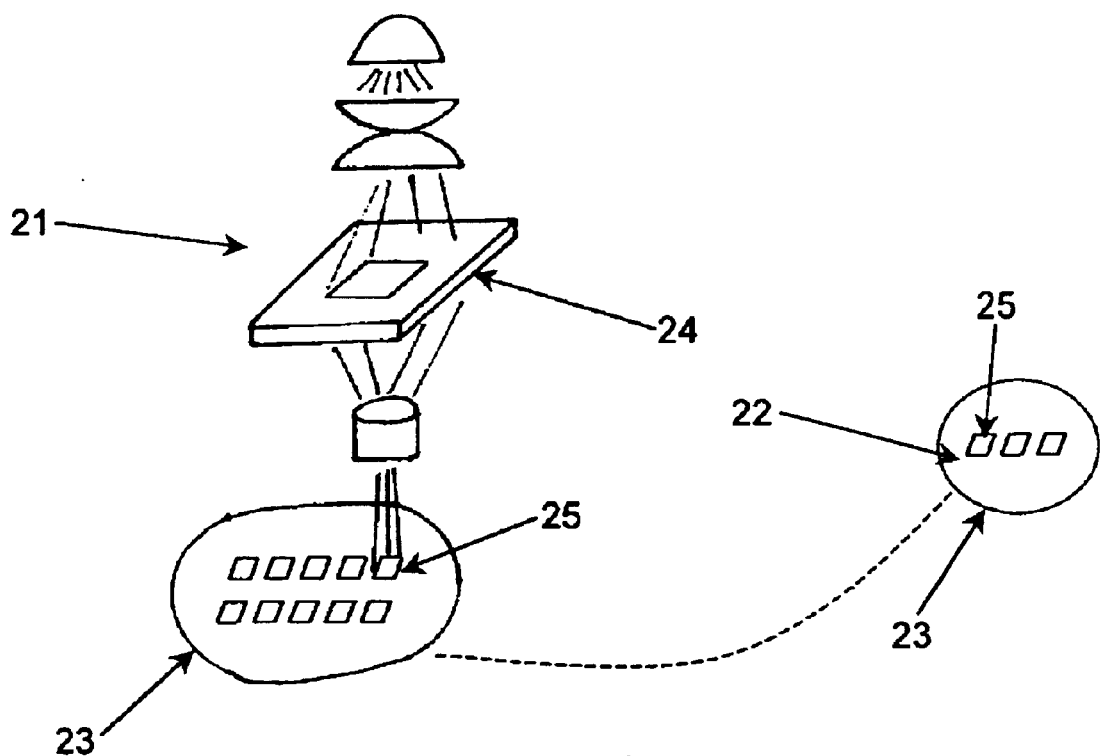
FIG. 10 is a view showing a stepper for producing devices of silicon wafers which is calibrated in accordance with the present invention.
Figure 11:
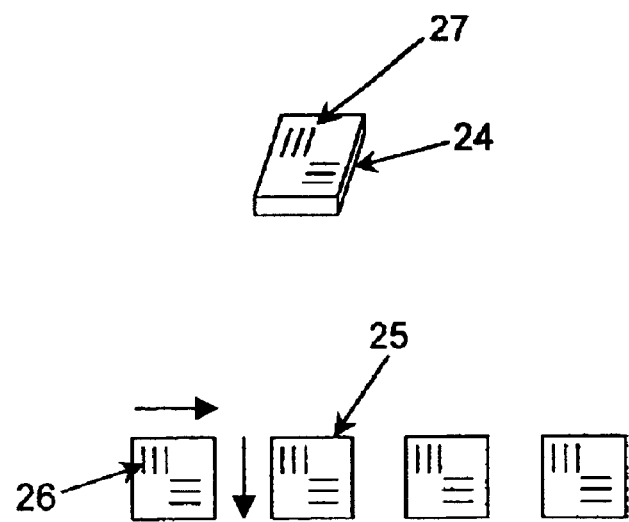
FIG. 11 is a view showing schematically a mask and patterns or images produced on a mask and also illustrating the directions of measurement of the image patterns.

FIG. 10 shows a stepper 21 for producing patterns on silicon wafers, which is calibrated in accordance with the inventive method. A photo sensitive layer 22, typically a photo resist, is applied on a substrate 23. A mask 24 is arranged in the stepper 21, and radiation, such as light, passes through the mask 24 and produces a plurality of images 25 on the photo sensitive layer 22. The images 25 have patterns 26 which substantially correspond to the patterns 27 of the mask 24.

The calibration of reduction of the stepper (or magnification of a scanning electron microscope) is performed by comparing the patterns 26 of the silicon wafer with the pattern 27 of the mask 24. In particular, the pitch of the features of the patterns 26 of the silicon wafer 25 is compared with the pitch of the features of the pattern 27 of the mask 24. In order to measure the pitch of the features of the patterns 27 of the images 25, the silicon wafer is introduced into a scanning electron microscope and the method can be performed as disclosed in our patent application Ser. No. 09/346,902 which provides a highly precise measurement. Of course, other methods can be utilized as well.

The pitch between the features of the pattern on the mask can be measured in the same way. Also, a commercial mask calibration instrument can be used for this purpose.

Then the value of the pitch of the features in areas of the pattern of each image is compared with the value of the pitch of the features of the corresponding area of the mask, and a reduction value of the pattern of each image is obtained, and its deviation from the standard reduction value of the stepper is determined. This process is repeated for a plurality of locations on the wafer.

The thusly obtained data characterize the behavior of the stepper over its reduction ratio property.

The same is true for calibration of magnification of an electronic scanning microscope.

It will be understood that each of the elements described above, or two or more together, may also find a useful application in other types of constructions and methods differing from the types described above.

While the invention has been illustrated and described as embodied in method of calibration of modification of optical devices, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by letters Patent is set forth in the appended claims.

What is claimed is:

1. A method of calibrating magnification of optical devices, comprising the steps of providing a mask with a predetermined pattern, projecting radiation through the mask so as to form a patterned projected image; and comparing a pattern of the projected image with a pattern of the mask to determine deviations of the projected image from the image of the mask, said providing including forming a mask by an optical source producing an interference pattern corresponding to the desired pattern of the mask.

2. A method as defined in claim 1, wherein said comparing includes comparing a size of the projected image with the size of the image on the mask.

3. A method as defined in claim 1, wherein said providing The mask includes providing a mask which has at least two fields each having a plurality of features spaced from one another in one direction so that the directions of spacing of the features in said two fields are transverse to one another.

4. A method as defined in claim 3, wherein said features in each of said field are evenly spaced from one another.

5. A method as defined in claim 3, wherein said features in each of said fields are parallel to one another.

6. A method as defined in claim 3; and further comprising arranging The mask so that said features of at least one of said fields are aligned with a principal axis of the optical device.

7. A method as defined in claim 3, wherein said features are arranged so that a spacing between the features of one of said fields is different from the spacing of said features of the other of said fields.

8. A method as defined in claim 1; and further comprising moving an article on which the image is projected relative to the optical device so as to produce a plurality of images with a plurality of patterns, said comparing includes comparing the plurality of patterns of the plurality of images with the pattern of the mack.

9. A method as defined in claim 1, wherein said obtaining of the projected image includes providing a substrate, projecting the pattern through the mask on the substrate, and obtaining the projected image on the substrate.

10. A method as defined in claim 1, wherein said obtaining of projected image includes passing the radiation through the mask and obtaining an electronic image with a pattern, said comparing includes comparing the pattern of the electronic image with the pattern of the mask.

11. A method as defined in claim 1, wherein said comparing includes comparing a deviation of a magnification of the pattern and the image relative to the pattern of the mask from a standard deviation.

12. A method of calibrating magnification of optical devices, comprising the steps of providing a mask with a predetermined pattern, projecting radiation through the mask so as to form a patterned projected image; and comparing a pattern of the projected image with a pattern of the mask to determine deviations of the projected image from the image of the mask, said providing includes producing the mask by an optical source which generates an interference pattern and acts on a chemical substance to cause etching of corresponding areas of the mask so as to produce the desired pattern of the mask.

* * * * *